(12) United States Patent
Sharf et al.

(10) Patent No.: US 10,178,804 B2
(45) Date of Patent: Jan. 8, 2019

(54) HEAT SPREADER FOR AN ELECTRICAL CONNECTOR ASSEMBLY

(71) Applicant: TE CONNECTIVITY CORPORATION, Berwyn, PA (US)

(72) Inventors: Alex Michael Sharf, Harrisburg, PA (US); Nathan Lincoln Tracy, Harrisburg, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 15/496,718

(22) Filed: Apr. 25, 2017

(65) Prior Publication Data

US 2018/0310435 A1    Oct. 25, 2018

(51) Int. Cl.
H05K 7/20       (2006.01)
H01R 12/70      (2011.01)
H05K 7/10       (2006.01)

(52) U.S. Cl.
CPC ......... *H05K 7/20409* (2013.01); *H01R 12/70* (2013.01); *H05K 7/1092* (2013.01)

(58) Field of Classification Search
CPC ............. H05K 7/20409; H05K 7/1092; H05K 7/20436; H05K 9/0058; H05K 7/2039; H01R 12/70; H01R 12/721; H01R 12/716; H01R 13/6471; H01R 13/514; H01R 13/26; H04B 10/40; G02B 6/3869; G02B 6/3893; G02B 6/4269

USPC ........ 361/715, 709, 704; 165/80.2; 439/328, 439/345, 495, 862, 607.2, 607.21; 385/92, 147, 53

See application file for complete search history.

(56) References Cited

U.S. PATENT DOCUMENTS

| | | | |
|---|---|---|---|
| 7,583,510 B2 * | 9/2009 | Wang ............... | H01R 13/65802 361/753 |
| 8,613,632 B1 * | 12/2013 | Nichols .............. | H01R 13/6587 439/485 |
| 9,389,368 B1 | 7/2016 | Sharf | |
| 9,419,380 B2 | 8/2016 | Sharf et al. | |
| 9,620,907 B1 | 4/2017 | Henry et al. | |
| 9,668,379 B1 * | 5/2017 | Bucher .............. | H05K 7/20436 |
| 9,912,107 B2 | 3/2018 | Bucher et al. | |
| 2016/0211623 A1 * | 7/2016 | Sharf ................... | H01R 13/665 |

* cited by examiner

*Primary Examiner* — Dion R Ferguson
*Assistant Examiner* — Mandeep S Buttar (57) ABSTRACT

A heat spreader includes a main body extending between a front and a rear configured to be mounted to a cage and heat transfer fingers cantilevered forward from the front of the main body. The heat transfer fingers each have a fixed end, a distal end, a top, a bottom and mating edges facing each other across gaps. The heat transfer fingers are configured to be received in corresponding channels between heat transfer fins of a pluggable module as the pluggable module is installed in the cage through the front end with the gaps receiving the heat transfer fins. The mating edges are configured to face and be thermally coupled to corresponding heat transfer fins. The heat transfer fingers transfer heat from the heat transfer fins rearward toward the distal ends and into the main body.

20 Claims, 3 Drawing Sheets

HEAT SPREADER FOR AN ELECTRICAL CONNECTOR ASSEMBLY

BACKGROUND OF THE INVENTION

The subject matter described herein relates to heat spreaders for electrical connector assemblies of communication systems.

At least some known communication systems include electrical connector assemblies, such as input/output (I/O) connector assemblies, that are configured to receive a pluggable module and establish a communicative connection between the pluggable module and an electrical connector of the electrical connector assembly. As one example, a known receptacle assembly includes a cage that is mounted to a circuit board and configured to receive a small form-factor (SFP) pluggable transceiver. The cage defines an elongated cavity that extends between an opening of the cavity and a communication connector that is disposed within the cavity and mounted to the circuit board. The pluggable module is inserted through the opening and advanced toward the electrical connector in the cavity. The pluggable module and the electrical connector have respective electrical contacts that engage one another to establish a communicative connection. Conventional communication systems may include multiple cavities and communication connectors for mating with multiple pluggable modules.

Challenges often encountered in the design of the communication system involve dissipating heat generated during operation of the communication system and minimizing electromagnetic interference (EMI), as both heat and EMI negatively affect module/system reliability and electrical performance. Heat dissipation is often accomplished by airflow through the components; however, airflow in some systems may be inadequate, such as due to tight space constraints. Some communication systems utilize pluggable modules with fins along the top to increase the surface area of the body of the pluggable module for enhanced heat transfer. Some communication systems utilize heat sinks to dissipate heat from the pluggable modules; however, such heat sinks are typically arranged along the top of the cage and increase the overall size of the communication system, which may be undesirable. Additionally, with finned pluggable modules, thermal coupling between the heat sink and the fins may be difficult. For example, some known pluggable modules provide a panel or cover over the tops of the fins to provide a surface for the heat sink to engage. However, the cover closes off access to the channels between the fins such that the heat sink is unable to directly engage the fins.

Accordingly, there is a need to improve heat removal from pluggable modules in caged electrical connector assemblies.

BRIEF DESCRIPTION OF THE INVENTION

In an embodiment, a heat spreader is provided to be used in a cage of an electrical connector assembly for thermally coupling to a pluggable module having heat transfer fins extending therefrom with channels between the heat transfer fins received in the cage through a front end of the cage and mated to a communication connector located proximate to a back end of the cage. The heat spreader includes a main body extending between a front and a rear configured to be mounted to the cage proximate to the back end of the cage and heat transfer fingers cantilevered forward from the front of the main body. The heat transfer fingers each have a fixed end at the main body and a distal end forward of the fixed end. Each heat transfer finger has a top, a bottom and mating edges facing each other across gaps between the heat transfer fingers. The heat transfer fingers are configured to be loaded into the corresponding channels between the heat transfer fins as the pluggable module is loaded into the cage through the front end with the gaps receiving the heat transfer fins. The mating edges are configured to face and be thermally coupled to corresponding heat transfer fins. The heat transfer fingers transfer heat from the heat transfer fins rearward toward the distal ends and into the main body.

In another embodiment, an electrical connector assembly is provided including a cage having a plurality of panels defining a module cavity configured to receive a pluggable module therein having heat transfer fins extending therefrom separated by channels. The cage extends between a front end and a back end and has a port to the pluggable cavity open at the front end. A communication connector is received in the cage proximate to the rear end for electrically connecting to the pluggable module when the pluggable module is plugged into the cage. A heat spreader is received in the cage. The heat spreader includes a main body extending between a front and a rear configured to be mounted to the cage proximate to the back end of the cage and heat transfer fingers cantilevered forward from the front of the main body. The heat transfer fingers each have a fixed end at the main body and a distal end forward of the fixed end. Each heat transfer finger has a top, a bottom and mating edges facing each other across gaps between the heat transfer fingers. The heat transfer fingers are configured to be loaded into the corresponding channels between the heat transfer fins as the pluggable module is loaded into the cage through the front end with the gaps receiving the heat transfer fins. The mating edges are configured to face and be thermally coupled to corresponding heat transfer fins. The heat transfer fingers transfer heat from the heat transfer fins rearward toward the distal ends and into the main body.

In a further embodiment, a communication system is provided including a pluggable module having a pluggable body extending between a mating end and a cable end and having a module circuit board held in the pluggable body and provided at an end of a cable communicatively coupled to the module circuit board. The pluggable body has heat transfer fins extending therefrom separated by channels. The communication system includes a cage having a plurality of panels defining a module cavity configured to receive the pluggable module therein. The cage extends between a front end and a back end and has a port to the pluggable cavity open at the front end. The communication system includes a communication connector received in the cage proximate to the rear end for electrically connecting to the pluggable module when the pluggable module is plugged into the cage. The communication system includes a heat spreader received in the cage having a main body extending between a front and a rear configured to be mounted to the cage proximate to the back end of the cage and heat transfer fingers cantilevered forward from the front of the main body. The heat transfer fingers each have a fixed end at the main body and a distal end forward of the fixed end. Each heat transfer finger has a top, a bottom and mating edges facing each other across gaps between the heat transfer fingers. The heat transfer fingers are configured to be loaded into the corresponding channels between the heat transfer fins as the pluggable module is loaded into the cage through the front end with the gaps receiving the heat transfer fins. The mating edges are configured to face and be thermally coupled to corresponding heat transfer fins. The heat transfer fingers transfer heat from the heat transfer fins rearward toward the distal ends and into the main body.

DETAILED DESCRIPTION OF THE INVENTION

Embodiments set forth herein include communication systems providing electromagnetic interference (EMI) shielding and significant thermal transfer for the components thereof. Various embodiments of the communication system provide EMI shielding at the interface between pluggable modules and corresponding communication connectors. Various embodiments of the communication system provide a heat spreader in a cage for transferring heat from a pluggable module received therein.

Figure 1:
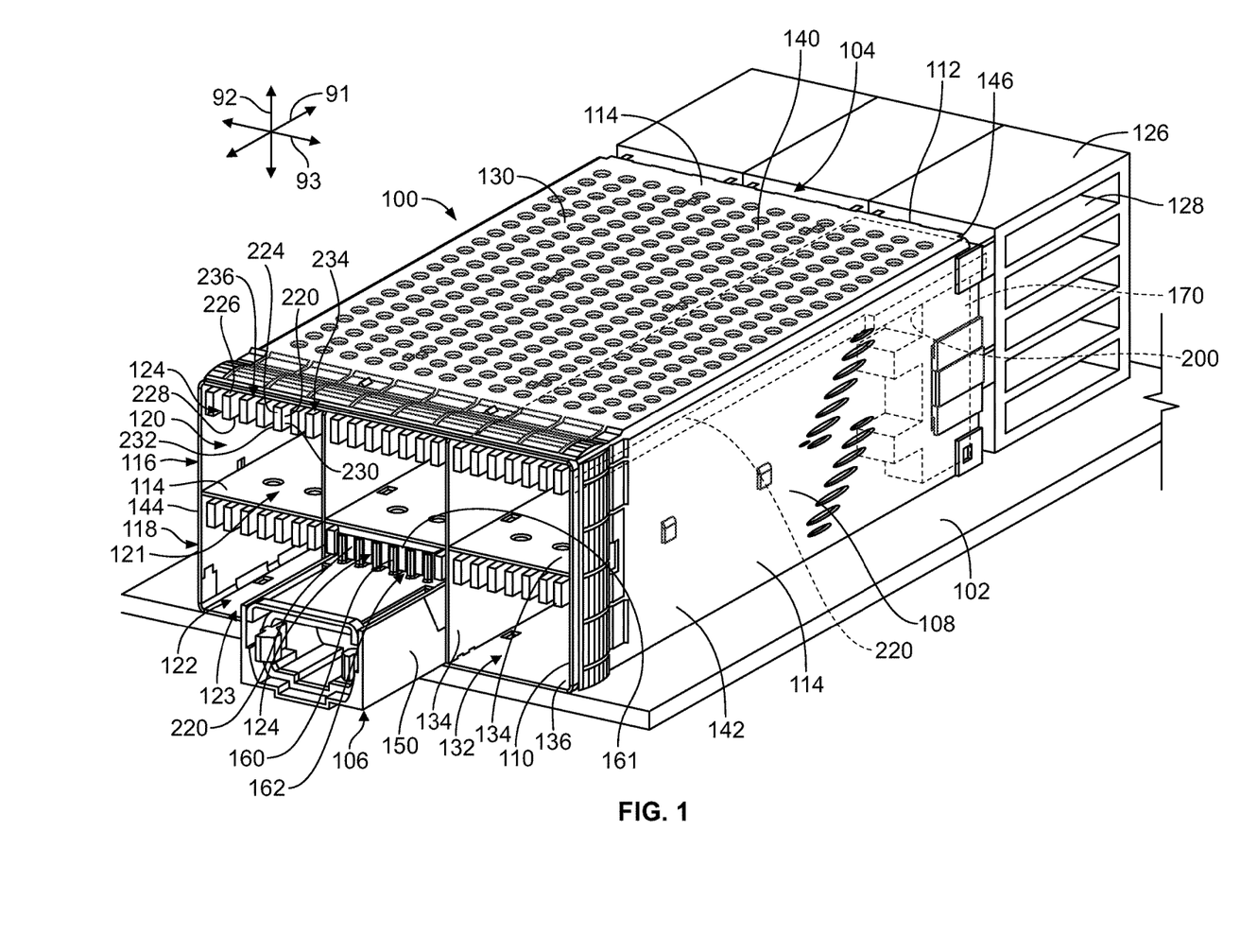
FIG. 1 is a perspective view of a communication system having an electrical connector assembly in accordance with an embodiment.

FIG. 1 is a perspective view of a communication system 100 in accordance with an embodiment. The communication system 100 includes a circuit board 102, an electrical connector assembly 104, such as a receptacle assembly, mounted to the circuit board 102, and one or more pluggable modules 106 that are configured to communicatively engage the electrical connector assembly 104. Only one pluggable module 106 is shown in FIG. 1, but it is understood that multiple pluggable modules 106 may simultaneously engage the electrical connector assembly 104. The communication system 100 is oriented with respect to a mating or insertion axis 91, an elevation axis 92, and a lateral axis 93. The axes 91-93 are mutually perpendicular. Although the elevation axis 92 appears to extend in a vertical direction parallel to gravity in FIG. 1, it is understood that the axes 91-93 are not required to have any particular orientation with respect to gravity. Moreover, relative or spatial terms such as "front," "back," "top," or "bottom" may be described herein in reference to the illustrated embodiment and orientation of the illustrated embodiment and are only used to distinguish the referenced elements and do not necessarily require particular positions or orientations in the communication system 100 or in the surrounding environment of the communication system 100.

The communication system 100 may be part of or used with telecommunication systems or devices. For example, the communication system 100 may be part of or include a switch, router, server, hub, network interface card, or storage system. In the illustrated embodiment, the pluggable module 106 is configured to transmit data signals in the form of electrical signals. In other embodiments, the pluggable module 106 may be configured to transmit data signals in the form of optical signals. The circuit board 102 may be a daughter card or a mother board and include conductive traces (not shown) extending therethrough.

The electrical connector assembly 104 includes a receptacle housing or cage 108 that is mounted to the circuit board 102. The cage 108 may be arranged at a bezel or faceplate (not shown) of a chassis of the system or device, such as through an opening in the faceplate. As such, the cage 108 is interior of the device and corresponding faceplate and the pluggable module(s) 106 is installed in the cage 108 from the outside or exterior of the device and corresponding faceplate. When the electrical connector assembly 104 is mounted to the circuit board 102, the electrical connector assembly 104 is electrically coupled to the circuit board 102 and, in particular, to ground planes (not shown) within the circuit board 102 to electrically ground the electrical connector assembly 104. As such, the electrical connector assembly 104 may reduce EMI leakage that may negatively affect electrical performance of the communication system 100.

The cage 108 includes a front end 110 and an opposite back end 112. The front end 110 may be provided at, and extend through an opening in, the faceplate. The pluggable module 106 is installed in the cage 108 in a mating direction parallel to the mating axis 91 through the front end 110. The mating axis 91 extends between the front and back ends 110, 112. The front end 110 is viewable to a user when the user is inserting the pluggable module 106 into the electrical connector assembly 104.

The cage 108 is configured to contain or block electromagnetic interference (EMI) and guide the pluggable module(s) 106 during a mating operation. For example, the cage 108 may be formed from a plurality of interconnected sheets or panels 114 that are interconnected with one another to form the cage 108. The panels 114 may be formed from a conductive material, such as sheet metal and/or a polymer having conductive particles. In the illustrated embodiment, the panels 114 are stamped and formed from sheet metal. Optionally, portions of the panels 114 may be non-conductive. In some embodiments, the cage 108 is configured to facilitate airflow through the cage 108 to transfer heat (or thermal energy) away from the electrical connector assembly 104 and pluggable module(s) 106. The air may flow from inside the cage 108 (for example, behind the faceplate) to the external environment (for example, forward of the faceplate) or from outside the cage 108 into the interior of the cage 108. Fans or other air moving devices may be used to increase airflow through the cage 108 and over the pluggable module(s) 106. The panels 114 may include openings to allow airflow therethrough. The openings may be sized small enough such that the panels 114 provide effective EMI shielding.

In the illustrated embodiment, the cage 108 includes a first (or upper) row 116 of elongated module cavities 120 and a second (or lower) row 118 of elongated module cavities 122. The module cavities 120, 122 are separated by corresponding panels 114. Each of the module cavities 120, 122 extends between the front and back ends 110, 112. The module cavities 120, 122 have respective openings or ports 121, 123 that are sized and shaped to receive corresponding pluggable modules 106. The module cavities 120, 122 may have the same or similar dimensions and extend lengthwise in a direction that is parallel to the mating axis 91. In the illustrated embodiment, each upper module cavity 120 is stacked over a corresponding lower module cavity 122 such that the lower module cavity 122 is positioned between the upper module cavity 120 and the circuit board 102. In an exemplary embodiment, the module cavities 120, 122 are arranged in a plurality of columns. Any number of module cavities may be provided including a single row and/or a single column of module cavities.

The panels 114 of the cage 108 form separator plates between the module cavities 120, 122. The separator plates may extend generally parallel to the mating axis 91 at least partially between the front end 110 and the back end 112. In an exemplary embodiment, the module cavities 120, 122 include heat spreaders 124 therein configured to thermally engage and transfer heat from the pluggable modules 106. In the illustrated embodiment, the heat spreaders 124 extend along top surfaces of the pluggable modules 106 to enhance heat transfer from the pluggable modules 106 located in the module cavities 120, 122; however, the heat spreaders 124 may be located elsewhere in the module cavities 120, 122 to transfer heat from other areas of the pluggable modules 106.

In an exemplary embodiment, the heat spreaders 124 transfer heat to an exterior of the cage 108, such as to a heat sink block 126 behind the cage 108 and/or on top of the cage 108. The heat sink block 126 may have fins 128 to provide efficient heat dissipation. For example, an active airflow device, such as a fan, may blow air over the fins 128 of the heat sink block 126 to cool the heat sink block 126. The heat spreaders 124 may be directly thermally coupled to the heat sink block 126. In other various embodiments, the heat spreaders 124 may be integral with the heat sink block 126 such that no interface is provided therebetween. The heat sink block 126, in such embodiments, defines an external portion of the heat spreaders 124. Optionally, multiple heat spreaders 124 may be associated with one heat sink block 126. The heat sink block 126 may be mounted to the circuit board 102 and/or the cage 108. In the illustrated embodiment, the heat sink block 126 is located behind the cage 108; however, the heat sink block 126 may be located at other locations such as above the cage 108 or elsewhere in alternative embodiments.

The cage 108 includes a main panel or shell 130 that surrounds a cavity 132, a plurality of interior panels 134 coupled to the shell 130, and a base panel 136 coupled to the shell 130. The main panel 130, the interior panels 134, and the base panel 136 may be stamped and formed from sheet metal. The main panel 130, the interior panels 134, and the base panel 136 are assembled to form the module cavities 120, 122. For example, the interior panels 134 may separate the cavity 132 into the individual module cavities 120, 122. In an exemplary embodiment, the main panel 130 includes a top panel 140, side panels 142, 144, and a back panel 146 formed integral with each other; however, any of such panels may be separate and coupled to the other panels. The interior panels 134 are positioned within the cavity 132. The interior panels 134 partition or divide the cavity 132 into the separate module cavities 120, 122. Various interior panels 134 may define a top panel for one module cavity 122 and the same interior panel 134 may define a bottom panel for another module cavity 120. The heat spreaders 124 may be coupled to corresponding panels 114, such as the interior panels 134, the top panel 140, the side panels 142, 144, the back panel 136, and the like.

In an exemplary embodiment, the pluggable module 106 is an input/output (I/O) module configured to be inserted into and removed from the electrical connector assembly 104. The pluggable module 106 is configured to be inserted into one of the module cavities 120, 122 of the cage 108 and advanced in a mating direction along the mating axis 91 to mate with a communication connector housed within the cage 108. The pluggable module 106 may directly engage the corresponding heat spreader 124 to enhance heat transfer from the pluggable module 106 when in use. In some embodiments, the pluggable module 106 is a small form-factor pluggable (SFP) transceiver or quad small form-factor pluggable (QSFP) transceiver. The pluggable module 106 may satisfy certain technical specifications for SFP or QSFP transceivers, such as Small-Form Factor (SFF)-8431. In some embodiments, the pluggable module 106 is configured to transmit data signals up to 2.5 gigabits per second (Gbps), up to 5.0 Gbps, up to 10.0 Gbps, or more. By way of example, the electrical connector assembly 104 and the pluggable module 106 may be similar to the receptacle cages and transceivers, respectively, which are part of the SFP+ product family available from TE Connectivity.

Figure 2:
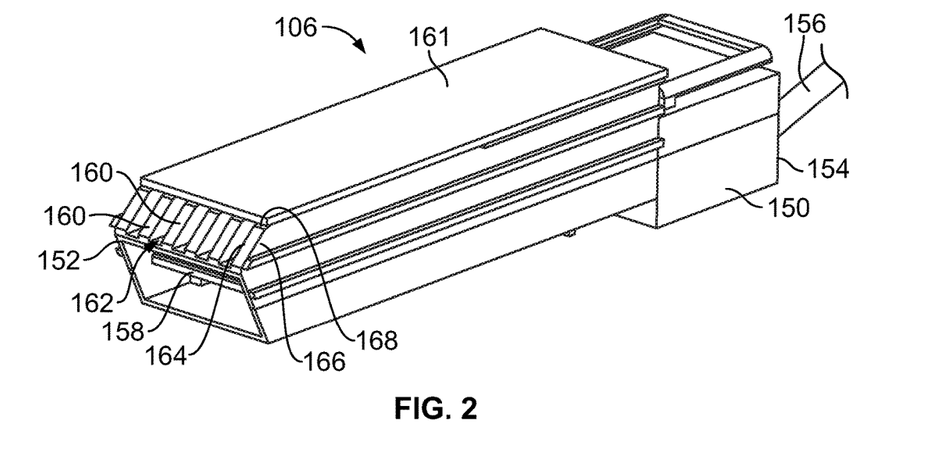
FIG. 2 is a perspective view of a pluggable module of the communication system in accordance with an exemplary embodiment.

FIG. 2 is a perspective view of the pluggable module 106 in accordance with an exemplary embodiment. In some embodiments, the pluggable module 106 is an input/output cable assembly having a pluggable body 150. The pluggable body 150 includes a mating end 152 and an opposite cable end 154. A cable 156 is coupled to the pluggable body 150 at the cable end 154. The pluggable module 106 includes a module circuit board 158 that is communicatively coupled to electrical wires or optical fibers (not shown) of the cable 156. The module circuit board 158 may be exposed at the mating end 152 for mating with a communication connector of the electrical connector assembly 104 (shown in FIG. 1). The cable 156 may be communicatively coupled by directly terminating the electrical wires to the module circuit board 158, such as by soldering the electrical wires to the module circuit board. Alternatively, the cable 156 may be communicatively coupled by other processes, such as by using connectors at the end of the cable 156 and on the module circuit board 158. The module circuit board 158 is supported by the pluggable body 150.

In an exemplary embodiment, the pluggable body 150 is manufactured from a conductive material, such as a metal material. The pluggable body 150 provides EMI shielding for the circuit board 158. Optionally, the pluggable body 150 may provide heat transfer for the module circuit board 158, such as for the electronic components on the module circuit board 158. For example, the module circuit board 158 is in thermal communication with the pluggable body 150 and the pluggable body 150 transfers heat from the module circuit board 158.

In an exemplary embodiment, the pluggable body 150 includes a plurality of heat transfer fins 160 extending therefrom. In an exemplary embodiment, a panel or cover 161 is provided above the heat transfer fins 160 and thermally coupled to the fins 160. The cover 161 and the fins 160 may be integral with each other and may be integral with the pluggable body 150. The fins 160 and the cover 161 increase the surface area of the pluggable body 150 and allow greater heat transfer therefrom. The fins 160 and the cover 161 provide surfaces for thermal coupling with the heat spreader 124. The fins 160 may extend from any portion of the pluggable body 150, such as the top, the sides and/or the bottom. In the illustrated embodiment, the fins 160 are parallel plates with channels 162 therebetween. The cover 161 encloses the channels 162. The fins 160 have sides 164, 166 extending to outer ends 168. The cover 161 is provided at the outer ends 168. The sides 164, 166 may be tapered. The sides 164, 166 may extend continuously between opposite front and rear ends of the fins 160. In alternative embodiments, other types of fins 160 may be used. In other various embodiments, the pluggable module 106 may be provided without the cover 161.

Figure 3:
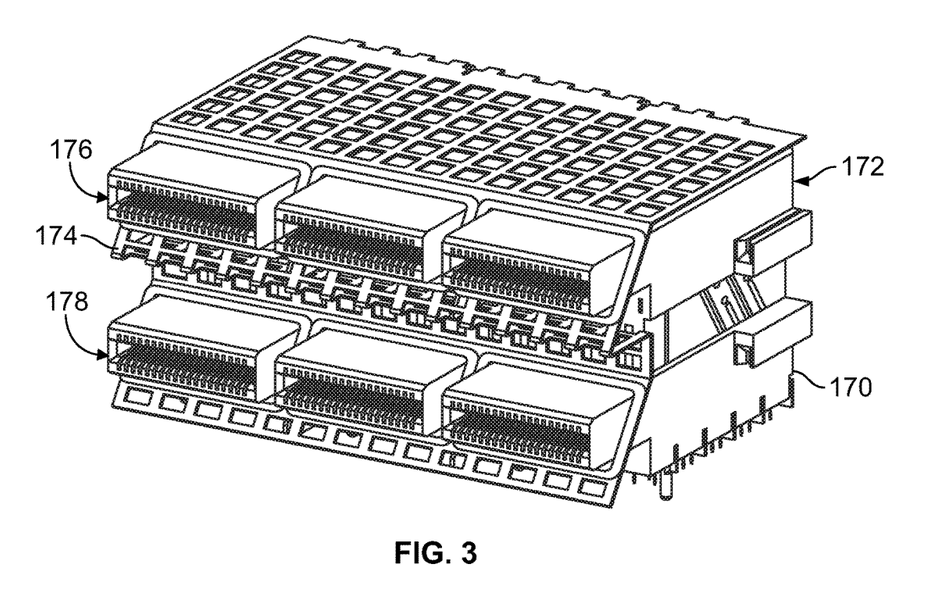
FIG. 3 is a front perspective view of a communication connector of the communication system in accordance with an exemplary embodiment.

FIG. 3 is a front perspective view of a plurality of communication connectors 170, which may be ganged together to form a communication module 172. The communication module 172 may have one or more panels 174 providing EMI shielding for the communication connectors 170. The communication connectors 170 are configured to be received in the cage 108 (shown in FIG. 1). The communication connectors 170 may be individually positioned in the cage 108 or may be installed in the cage 108 as a unit. The communication connectors 170 are configured to interface with the pluggable modules 106 (shown in FIG. 2) when the pluggable modules 106 are installed in the cage 108.

In an exemplary embodiment, each communication connector 170 has first and second mating interfaces 176, 178 for interfacing with different pluggable modules 106; however the communication connectors 170 may include a single mating interface or more than two mating interfaces in alternative embodiments. The first mating interface 176 is configured to be disposed within the upper module cavity 120 (shown in FIG. 1), and the second mating interface 178 is configured to be disposed within the lower module cavity 122 (shown in FIG. 1).

Figures 4, 5, 6:
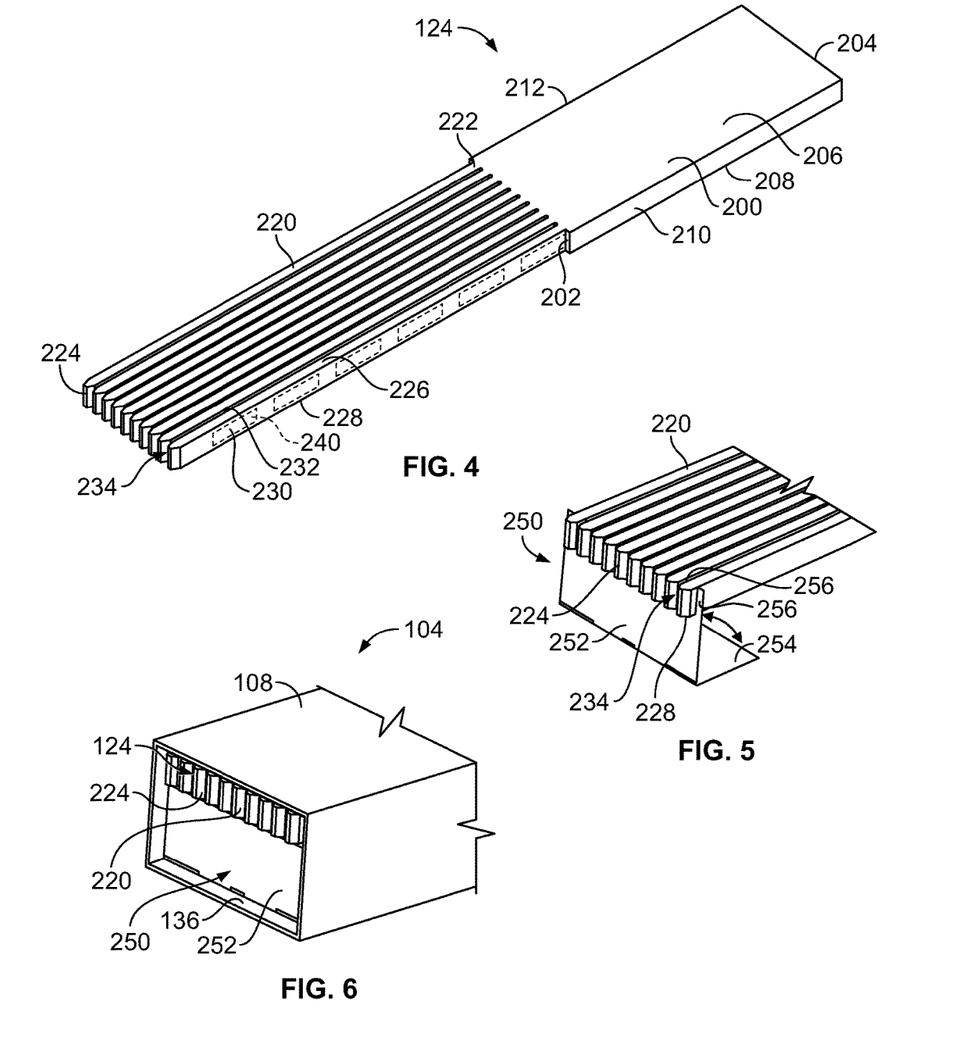
FIG. 4 is a perspective view of a heat spreader of the communication system in accordance with an exemplary embodiment.
FIG. 5 is a perspective view of a portion of the heat spreader showing a heat spreader support in accordance with an exemplary embodiment.
FIG. 6 is a front perspective view of a portion of the electrical connector assembly in accordance with an exemplary embodiment.

FIG. 4 is a perspective view of the heat spreader 124 in accordance with an exemplary embodiment. The heat spreader 124 includes a main body 200 extending between a front 202 and a rear 204. The main body 200 includes a top 206, a bottom 208 and opposite sides 210, 212. The heat spreader 124 includes a plurality of heat transfer fingers 220 extending forward from the main body 200. The heat transfer fingers 220 extend between fixed ends 222 and distal ends 224. Each heat transfer finger 220 includes a top 226, a bottom 228 and first and second mating edges 230, 232 extending between the top 226 and the bottom 228. The mating edges 230, 232 face each other across gaps 234 between the heat transfer fingers 220. In an exemplary embodiment, the heat transfer fingers 220 are cantilevered forward from the front 202 of the main body 200 at the fixed ends 222. The heat transfer fingers 220 are independently movable relative to each other from the cantilevered fixed ends 222.

The heat spreader 124 is manufactured from a thermally conductive material, such as a metal material, a ceramic material, a thermally conductive polymer material, and the like. The heat spreader 124 may be extruded, molded, blanked, stamped, milled or formed by other manufacturing processes. In an exemplary embodiment, the heat transfer fingers 220 are integral with the main body 200.

In an exemplary embodiment, the heat transfer fingers 220 are coplanar with the main body 200. For example, the tops 226 of the heat transfer fingers 220 may be generally coplanar with the top 206 of the main body 200 and/or the bottoms 228 of the heat transfer fingers 220 may be generally coplanar with the bottom 208 of the main body 200. Optionally, the main body 200 may include one or more steps, protrusions, or other features extending from the top 206 and/or the bottom 208 to locate the heat spreader 124 in the cage 108, such as to engage one or more portions of the cage 108 and/or the communication connector 170.

The heat transfer fingers 220 extend forward of the front 202 of the main body 200. In an exemplary embodiment, no portion of the main body 200 is positioned above the heat transfer fingers 220. The heat transfer fingers 220, in an exemplary embodiment, are only connected to the main body 200 at the fixed ends 222 such that the tops 226 and the bottoms 228 of the heat transfer fingers 220 are free of the main body 200.

With additional reference back to FIGS. 1 and 2 and the pluggable module 106, the heat transfer fingers 220 are configured to be received in corresponding channels 162 (FIG. 2) of the pluggable module 106 between corresponding heat transfer fins 160 (FIG. 2). The gaps 234 receive the corresponding heat transfer fins 160. In an exemplary embodiment, the distal ends 224 of the heat transfer fingers 220 are chamfered to provide a lead-in to the gaps 234.

When the pluggable module 106 is installed in the cage 108 (FIG. 1), the heat spreader 124 is thermally coupled to the pluggable module 106. The mating edges 230, 232 are thermally coupled to the heat transfer fins 160, such as to the sides 164, 166, when the heat transfer fins 160 are received in the gaps 234. The bottoms 228 may be thermally coupled to the pluggable module 106, such as to the top surface of the pluggable body 150 (FIG. 2). Optionally, the tops 226 may be thermally coupled to the pluggable module 106, such as to the cover 161 (FIG. 2). For example, the cover 161 is configured to be received in a space 236 defined between the tops 226 of the heat transfer fingers 220 and the interior panel 134 or the top panel 140 at the top of the corresponding module cavity 122, 120, respectively. Because the heat transfer fingers 220 are cantilevered from the main body 200 (shown in phantom in FIG. 1), there is no corresponding supporting structure above the heat transfer fingers 220, thereby leaving the space 236 for the cover 161. The heat transfer fingers 220 are received in the channels 162 below the cover 161, above the top surface of the pluggable body 150 and between the corresponding heat transfer fins 160. There is a large amount of surface area for contact and thermal coupling between the heat transfer fingers 220 and the pluggable module 106.

In various embodiments, the main body 200 is directly coupled to corresponding panels 114 (FIG. 1) of the cage 108 to position the heat spreader 124 in the cage 108 and position the heat transfer fingers 220 for reception in the channels 162. Optionally, the main body 200 is positioned at or near the back panel 146 (FIG. 1). For example, the main body 200 may be positioned near the communication connector 170 (shown in phantom in FIG. 1), such as directly above the communication connector 170 or immediately forward of the communication connector 170. Optionally, the main body 200 may be in thermal communication with the communication connector 170 to dissipate heat from the communication connector 170.

In an exemplary embodiment, the heat transfer fingers 220 are solid beams. The gaps 234 may be wide enough to accommodate the heat transfer fins 160 without interference between the heat transfer fingers 220 and the heat transfer fins 160. For example, the mating edges 230, 232 may be positioned in close proximity to the heat transfer fins 160 without direct physical contact therebetween. Optionally, either the mating edges 230 or the mating edges 232 may engage the corresponding heat transfer fins 160 without the other mating edges 230 or 232 engaging the corresponding heat transfer fins 160 to avoid binding between the heat spreader 124 and the pluggable module 106 during installation of the pluggable module 106 into the cage 108.

In other alternative embodiments, the heat transfer fingers 220 may be compressible and the gaps 234 may be narrower than the heat transfer fins 160 such that, when the pluggable module 106 is installed in the cage 108, the heat transfer fingers 220 are compressed between the heat transfer fins 160 to ensure direct physical contact between the heat spreader 124 and the pluggable module 106. In various embodiments, the heat spreader 124 may include intermediary components between the heat transfer fingers 220. For example, the heat spreader 124 may optionally include springs 240 (represented in phantom in FIG. 4) along the mating edges 230, 232 of the heat transfer fingers 220. The springs may be wavy springs extending along the length of the heat transfer fingers 220 to provide multiple points of contact between the heat transfer fingers 220 and the heat transfer fins 160 along the lengths thereof. The springs 240 may be separate components attached to the heat transfer fingers 220 or the heat transfer fins 160. For example, the springs 240 may be welded to the heat transfer fingers 220. In other various embodiments, the springs 240 may be integral with the heat transfer fingers 220. For example, the springs 240 may be stamped and formed from the heat transfer fingers 220. In other various embodiments, the intermediary components may be brush members extending from the heat transfer fingers 220. For example, the heat transfer fingers 220 may have a wire brush-like surface along the mating edges 230, 232, the top 226 and/or the bottom 228. The brush members may extend longitudinally, laterally, helically, radially or in a random pattern along the heat transfer fingers 220. For example, the heat transfer fingers 220 may include fibers having spaces therebetween. The fibers are configured to engage in thermal communication with the heat transfer fins 160 when the pluggable module 106 is installed in the cage 108. The intermediary components enhance the thermal transfer between the heat transfer fingers 220 and the heat transfer fins 160 by providing many points of direct contact between the heat transfer fingers 220 and heat transfer fins 160 without providing too much mating friction between the heat spreader 124 and the pluggable module 106.

FIG. 5 is a perspective view of a portion of the heat spreader 124 showing a heat spreader support 250 in accordance with an exemplary embodiment. FIG. 6 is a front perspective view of a portion of the electrical connector assembly 104 in accordance with an exemplary embodiment showing a single port version of the electrical connector assembly 104 with the heat spreader support 250 therein. The heat spreader support 250 includes a support panel 252 used to support the heat transfer fingers 220. For example, because the heat transfer fingers 220 are cantilevered from the main body 200 (shown in FIG. 4), the support panel 252 supports the heat transfer fingers 220 remote from the main body 200. In the illustrated embodiment, the support panel 252 supports the heat transfer fingers 220 proximate to the distal ends 224. The support panel 252 supports the heat transfer fingers 220 from below. For example, the support panel 252 engages the bottoms 228 of the heat transfer fingers 220.

In an exemplary embodiment, the support panel 252 is hingedly coupled to a base panel 254 to allow the support panel 252 to open and close during use. The base panel 254 may be secured to the base panel 136 of the cage 108. In alternative embodiments, the support panel 252 may be directly coupled to the cage 108, such as to the base panel 136, without the need for the base panel 254. In an exemplary embodiment, the support panel 252 is spring loaded to automatically position the support panel 252 in a closed or supporting position (FIG. 6). When the pluggable module 106 is installed in the cage 108, the pluggable module 106 presses against the support panel 252 to move the support panel 252 to an open position by rotating the support panel 252 downward against the base panel 254. The pluggable module 106 is then able to be installed in the cage 108. When the pluggable module 106 is positioned in the cage 108, the pluggable module 106 supports the distal ends 224 of the heat transfer fingers 220. When the pluggable module 106 is removed from the cage 108, the support panel 252 may again be closed to the supporting position. In an exemplary embodiment, when the support panel 252 is closed, the support panel 252 may block contaminants, such as dust and debris, from entering the cage 108. In an exemplary embodiment, when the support panel 252 is closed, the support panel 252 seals the port from EMI.

In an exemplary embodiment, the heat spreader support 250 includes tabs 256 at the top of the support panel 252. The tabs 256 may be positioned in the gaps 234 to position the heat transfer fingers 220 relative to each other. For example, the tabs 256 may hold the relative positions of the heat transfer fingers 220 for mating with the pluggable module 106. In other various embodiments, the heat spreader support 250 may be provided without the tabs 256.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled.

As used in the description, the phrase "in an exemplary embodiment" and the like means that the described embodiment is just one example. The phrase is not intended to limit the inventive subject matter to that embodiment. Other embodiments of the inventive subject matter may not include the recited feature or structure. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A heat spreader configured to be used in a cage of an electrical connector assembly for thermally coupling to a pluggable module received in the cage through a front end of the cage and mated to a communication connector located proximate to a back end of the cage, the pluggable module having heat transfer fins extending therefrom with channels between the heat transfer fins, the heat spreader comprising:

a main body extending between a front and a rear, the main body configured to be mounted to the cage proximate to the back end of the cage; and heat transfer fingers cantilevered forward from the front of the main body, the heat transfer fingers each having a fixed end at the main body and a distal end forward of the fixed end, each heat transfer finger having a top, a bottom and mating edges facing each other across gaps between the heat transfer fingers, the heat transfer fingers being configured to be received in the corresponding channels between the heat transfer fins as the pluggable module is installed in the cage through the front end with the gaps receiving the heat transfer fins, the mating edges being configured to face and be thermally coupled to corresponding heat transfer fins, wherein the heat transfer fingers transfer heat from the heat transfer fins rearward toward the distal ends and into the main body.

2. The heat spreader of claim 1, wherein the heat transfer fingers are coplanar with the main body.

3. The heat spreader of claim 1, wherein the heat transfer fingers are aligned with the main body in a direction parallel to a loading direction of the pluggable module into the cage.

4. The heat spreader of claim 1, wherein the heat transfer fingers are only connected to the main body at the fixed ends such that the tops and the bottoms of the heat transfer fingers are free of the main body.

5. The heat spreader of claim 1, wherein the heat transfer fingers are compressible, the gaps being narrower than the heat transfer fins such that the heat transfer fingers are compressed between the heat transfer fins.

6. The heat spreader of claim 1, further comprising deflectable springs at the mating edges configured to engage the heat transfer fins when the pluggable module is loaded into the cage.

7. The heat spreader of claim 1, wherein the heat transfer fingers include fibers having spaces therebetween, the fibers being configured to engage in thermal communication with the heat transfer fins when the pluggable module is installed in the cage.

8. The heat spreader of claim 1, wherein the main body includes a thermal interface configured to be thermally coupled to a heat sink above the cage.

9. The heat spreader of claim 1, wherein the main body includes a thermal interface configured to be thermally coupled to a heat sink rearward of the cage.

10. The heat spreader of claim 1, wherein the main body includes a communication connector interface configured to engage the communication connector, the heat transfer fingers extending forward of the communication connector.

11. The heat spreader of claim 1, wherein the main body is configured to position the heat transfer fingers in the cage spaced apart from and parallel to a top panel of the cage.

12. The heat spreader of claim 1, wherein the tops of the heat transfer fingers are configured to engage in thermal communication with a cover extending over outer ends of the heat transfer fins.

13. The heat spreader of claim 1, wherein the tops of the heat transfer fingers, the bottoms of the heat transfer fingers and the mating edges of the heat transfer fingers are all configured to engage in direct thermal communication with the pluggable module to transfer heat from the pluggable module to the main body behind the heat transfer fingers.

14. An electrical connector assembly comprising:
a cage having a plurality of panels defining a module cavity configured to receive a pluggable module therein having heat transfer fins extending therefrom separated by channels, the cage extending between a front end and a back end, the cage having a port to the pluggable cavity open at the front end;
a communication connector received in the cage proximate to the rear end for electrically connecting to the pluggable module when the pluggable module is installed in the cage; and
a heat spreader disposed in the cage, the heat spreader comprising a main body extending between a front and a rear and being mounted to the cage proximate to the back end of the cage and heat transfer fingers cantilevered forward from the front of the main body, the heat transfer fingers each having a fixed end at the main body and a distal end forward of the fixed end, each heat transfer finger having a top, a bottom and mating edges facing each other across gaps between the heat transfer fingers, the heat transfer fingers being configured to be received in the corresponding channels between the heat transfer fins as the pluggable module is installed in the cage through the front end with the gaps receiving the heat transfer fins, the mating edges being configured to face and be thermally coupled to corresponding heat transfer fins, wherein the heat transfer fingers transfer heat from the heat transfer fins rearward toward the distal ends and into the main body.

15. The electrical connector assembly of claim 14, wherein the plurality of panels include a top panel along a top of the module cavity, the heat transfer fingers being parallel to and spaced apart from the top panel by a space, the space being configured to receive a portion of the pluggable module between the tops of the heat transfer fingers and the top panel.

16. The electrical connector assembly of claim 14, further comprising a heat spreader support coupled to the cage and configured to engage and support the heat transfer fingers remote from the main body.

17. The electrical connector assembly of claim 14, wherein the heat transfer fingers are coplanar with the main body.

18. The electrical connector assembly of claim 14, wherein the tops of the heat transfer fingers are configured to engage in thermal communication with a cover extending over outer ends of the heat transfer fins.

19. A communication system comprising:
a pluggable module having a pluggable body extending between a mating end and a cable end, the pluggable module has a module circuit board held in the pluggable body and provided at an end of a cable communicatively coupled to the module circuit board, the pluggable body having heat transfer fins extending therefrom separated by channels;
a cage having a plurality of panels defining a module cavity configured to receive the pluggable module therein, the cage extending between a front end and a back end, the cage having a port to the pluggable cavity open at the front end;
a communication connector disposed in the cage proximate to the rear end for electrically connecting to the pluggable module when the pluggable module is installed in the cage; and
a heat spreader disposed in the cage, the heat spreader comprising a main body extending between a front and a rear and being mounted to the cage proximate to the back end of the cage and heat transfer fingers cantilevered forward from the front of the main body, the heat transfer fingers each having a fixed end at the main body and a distal end forward of the fixed end, each heat transfer finger having a top, a bottom and mating edges facing each other across gaps between the heat transfer fingers, the heat transfer fingers being configured to be received in the corresponding channels between the heat transfer fins as the pluggable module is installed in the cage through the front end with the gaps receiving the heat transfer fins, the mating edges being configured to face and be thermally coupled to corresponding heat transfer fins, wherein the heat transfer fingers transfer heat from the heat transfer fins rearward toward the distal ends and into the main body.

20. The communication system of claim 19, wherein the pluggable module includes a cover over outer ends of the heat transfer fins to enclose the channels, and wherein the plurality of panels include a top panel along a top of the module cavity, the heat transfer fingers being parallel to and spaced apart from the top panel by a space, the space receives the cover of the pluggable module between the tops of the heat transfer fingers and the top panel.

* * * * *